(12) United States Patent
Fayaz et al.

(10) Patent No.: US 6,693,017 B1
(45) Date of Patent: Feb. 17, 2004

(54) MIMCAP TOP PLATE PULL-BACK

(75) Inventors: Mohammed Fazil Fayaz, Pleasantville, NY (US); Haining Yang, Wappingers Falls, NY (US); Uwe Kerst, Berlin (DE); Joseph J. Mezzapelle, Wappingers Falls, NY (US)

(73) Assignees: Infineon Technologies AG, Munich (DE); International Business Machines Corp., Armonk, NY (US)

( * ) Notice: Subject to any disclaimer, the term of this patent is extended or adjusted under 35 U.S.C. 154(b) by 0 days.

(21) Appl. No.: 10/407,587

(22) Filed: Apr. 4, 2003

(51) Int. Cl.[7] .................... H01L 21/20; H01L 27/08
(52) U.S. Cl. .............. 438/396; 438/253; 438/254; 438/397; 257/306; 257/303
(58) Field of Search ............... 438/239, 250, 438/253, 254, 386, 393, 396, 397, 398, 399; 257/296, 298, 300, 301, 303, 306, 309

(56) References Cited

U.S. PATENT DOCUMENTS

| | | | |
|---|---|---|---|
| 5,268,315 A | 12/1993 | Prasad et al. | |
| 5,351,163 A | 9/1994 | Dawson et al. | |
| 5,527,729 A | 6/1996 | Matsumoto et al. | |
| 5,654,581 A | 8/1997 | Radosevich et al. | |
| 5,701,647 A | * 12/1997 | Saenger et al. | 438/396 |
| 6,027,966 A | * 2/2000 | Saenger et al. | 438/239 |
| 6,037,264 A | 3/2000 | Hwang | |
| 6,160,316 A | 12/2000 | Gardner et al. | |
| 6,313,003 B1 | * 11/2001 | Chen | 438/396 |
| 6,426,250 B1 | * 7/2002 | Lee et al. | 438/239 |
| 6,465,297 B1 | * 10/2002 | Henry et al. | 438/253 |

OTHER PUBLICATIONS

Sze, S.M., "VLSI Technology," 1988; pp. 196–199, Second Edition, McGraw–Hill Publishing Company, U.S.
Mahnkopf, R. et al., "System on a Chip' Technology Platform for 0.18μm Digital, Mixed Signal & eDRAM Applications," IEDM, 1999, pp. 849–852.
Armacost, M., et al. "A High Reliability Metal Insulator Metal Capacitor for 0.18μm Copper Technology," IEDM, 2000.
Liu, R., et al. "Single Mask Metal–Insulator–Metal (MIM) Capacitor with Copper Damascene Metalilization for Sub–0.18μm Mixed Mode Signal and System–on–a–Chip (SoC) Applications," IITC, 2000, pp. 111–113.

* cited by examiner

Primary Examiner—Kevin M. Picardat
(74) Attorney, Agent, or Firm—Slater & Matsil, L.L.P.

(57) ABSTRACT

A MIM capacitor includes a bottom plate, a capacitor dielectric disposed over the bottom plate, and a top plate disposed over the capacitor dielectric. An etch stop material is disposed over the top plate, and the top plate has a width that is less than the width of the etch stop material width. The top plate edges may be pulled back during the removal of the resist used to pattern the top plate, by the addition of chemistries in the resist etch that are adapted to pull-back or undercut the top plate edges beneath the etch stop material.

35 Claims, 3 Drawing Sheets

MIMCAP TOP PLATE PULL-BACK

TECHNICAL FIELD

Embodiments of the present invention relate generally to the fabrication of semiconductor devices, and more particularly a method of manufacturing a metal-insulator-metal (MIM) capacitor and structure thereof.

BACKGROUND

Capacitors are used extensively in electronic devices for storing an electric charge. Capacitors essentially comprise two conductive plates separated by an insulator. Capacitors are used in filters, analog-to-digital converters, memory devices, various control applications, and mixed signal and analog devices, for example.

There is a demand in semiconductor device technology to integrate many different functions on a single chip, e.g. manufacturing analog and digital circuitry on the same die. MIM capacitor (MIMcap's) are often used in these integrated circuits. A MIM capacitor is a particular type of capacitor having two metal plates sandwiched around a capacitor dielectric that is parallel to a semiconductor wafer surface. They are rather large in size, being several hundred micrometers wide, for example, depending on the capacitance, which is much larger than a transistor or memory cell, for example. MIM capacitors are typically used as decoupling capacitors for microprocessor units (MPU's), RF capacitors in high frequency circuits, and filter and analog capacitors in mixed-signal products, as examples.

To form a MIMcap, the top metal plate must be lithographically patterned and etched. Prior art methods of etching the top metal plate typically utilize reactive ion etching (RIE). The RIE process should stop upon contact with the capacitor dielectric with minimal erosion of the capacitor dielectric in order to have good reliability performance. Erosion of the capacitor dielectric during the top metal plate RIE, particularly at the edges, has been shown to significantly deteriorate the reliability of a MIMcap.

SUMMARY OF THE INVENTION

Embodiments of the present invention achieve technical advantages as a method of fabricating a MIM capacitor and structure thereof, wherein the top plate is etched back or has a pull-back region beneath an etch stop layer, which improves the capacitor performance. The top plate edges are etched back so that no part of the top plate resides over a thinned region of capacitor dielectric.

In accordance with a preferred embodiment of the present invention, a method of manufacturing a semiconductor device includes providing a workpiece, depositing a first conductive layer over the workpiece, and depositing a capacitor dielectric over the first conductive layer. A second conductive layer is deposited over the capacitor dielectric layer, and a first insulating layer is disposed over the second connective layer. A photoresist is deposited over the first insulating layer, and the photoresist is patterned. Then, using the photoresist as a mask, the first insulating layer and the second conductive layer are patterned, leaving the edges of the second conductive layer exposed. The photoresist is removed, and a portion of the second conductive layer edges is then removed.

In accordance with another preferred embodiment of the present invention, a method of fabricating a MIM capacitor includes providing a workpiece, depositing a first conductive layer over the workpiece, and depositing a capacitor dielectric layer over the first conductive layer. A second conductive layer is deposited over the capacitor dielectric layer, an etch stop material is deposited over the second conductive layer, and a photoresist is deposited over the etch stop layer. The photoresist is patterned, and the photoresist is used as a mask to pattern the etch stop layer and the second conductive layer, leaving the edges of the second conductive layer exposed. The patterned second conductive layer forms a top plate of a MIM capacitor. The method includes removing the photoresist, removing a portion of the second conductive layer edges, patterning the capacitor dielectric layer, and patterning the first conductive layer to form a bottom plate of a MIM capacitor.

In accordance with yet another preferred embodiment, a MIM capacitor includes a comprising a bottom plate, the bottom plate having a first width, a capacitor dielectric disposed over the bottom plate, and a top plate disposed the capacitor dielectric. The top plate has a second width, wherein the second width is less than the first width. An etch stop material is disposed over the top plate, the etch stop material having a third width, wherein the second width is less than the third width.

Advantages of embodiments of the present invention include providing an improved MIM capacitor having a larger breakdown voltage and fewer incidents of electrical shorts. The MIM capacitor is less likely to have etch residue or defects due to under-etching the capacitor dielectric while patterning the top plate.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context. A problem of prior art MIM capacitors will first be discussed, followed by a description of preferred embodiments of the present invention and some advantages thereof. Only one MIM capacitor is shown in each figure; however, there may be two or more MIM capacitors and other devices and conductive lines formed within each semiconductor wafer shown.

Figure 1:
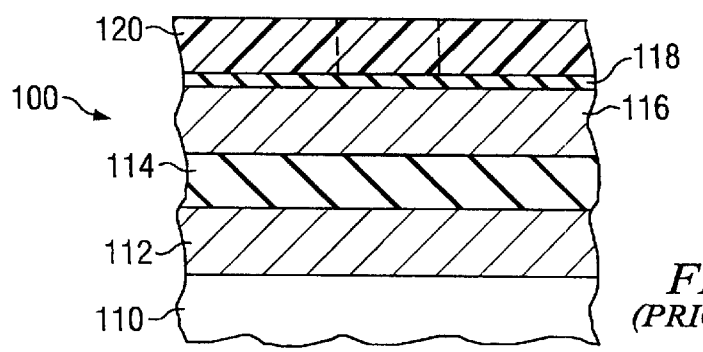
FIGS. 1 and 2 show cross-sectional views of a prior art MIM capacitor having a capacitor dielectric layer that is over-etched beneath the top plate.
Figure 2:
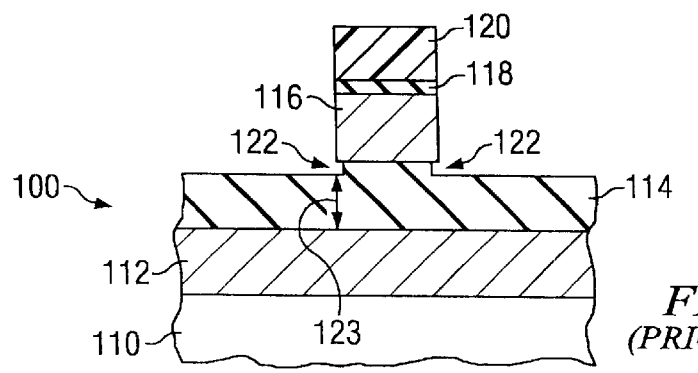

FIGS. 1 and 2 illustrate a problem that occurs in prior art MIM capacitor fabrication. In a typical fabrication scheme for MIM capacitors, a workpiece 110 is provided. A first conductive layer 112 is deposited over the workpiece 110, and a capacitor dielectric layer 114 is deposited over the first conductive layer 112. A second conductive layer 116 is deposited over the capacitor dielectric layer 114. An etch stop layer 118 is then deposited over the second conductive layer 116. The etch stop layer 118 will function as an etch stop when vias are formed later in the fabrication process to make electrical contact to the second conductive layer 116, which will form the top plate 116 of the capacitor.

Typically in prior art formation processes for MIM capacitors, the top plate 116 of the MIM capacitor is formed within the second conductive layer 116, and then later, the bottom plate 112 is patterned or formed within the first conductive layer 112. Alternatively, the bottom plate 112 may be patterned first. The top plate 116 is typically smaller in width than the bottom plate 112, so that there will be room for a via contact to be made to the bottom plate 112.

To form the top plate 116, a photoresist 120 is deposited over the wafer 100, for example, over the etch stop layer 118, as shown in FIG. 1. The photoresist 120 is then patterned and etched, for example, with the pattern of the top plate 116 that will be formed within the second conductive layer 116. Using the photoresist 120 as a mask, the etch stop layer 118 and the second conductive layer 116 are patterned, as shown in FIG. 2. The second conductive layer 116 is patterned using typical etch processes in the art, such as RIE, as an example.

A problem in prior art MIM capacitor formation is that during the etch process for the top plate 116, a top portion of the capacitor dielectric layer 114 is removed. During the top plate 116 etch, a portion of the capacitor dielectric 114 is removed from beneath the top plate 116 and an undercut region 122. This undercut region 122 creates a high likelihood that etch residue will be trapped within the undercut region 122, causing defects in the capacitor. Because the capacitor dielectric material 114 is thinned in the region 123 beneath the undercut region 122, the thinned region 123 of capacitor dielectric material 114 can create electrical shorts. There is also a high likelihood that voltage breakdown will occur at relatively low voltages in the thinned area 123 of the capacitor dielectric 114. The reduced thickness of the capacitor dielectric material 114 in region 123 results in edge effects, such has electric field enhancements. Therefore, the electric field is increased in the thinned region 123. These deleterious edge effects are particularly problematic in MIM capacitors having a long rectangular shape, along the long edge, for example.

Embodiments of the present invention achieve technical advantages by pulling back the edges of the top plate that is disposed over the capacitor dielectric material, after the top plate etch process, reducing the likelihood of voltage breakdown and shorts. The top-plate pull-back region is preferably removed by adding a chemistry in the photoresist removal process that is adapted to etch the top plate, so that an additional etch step is not required.

Figure 3:
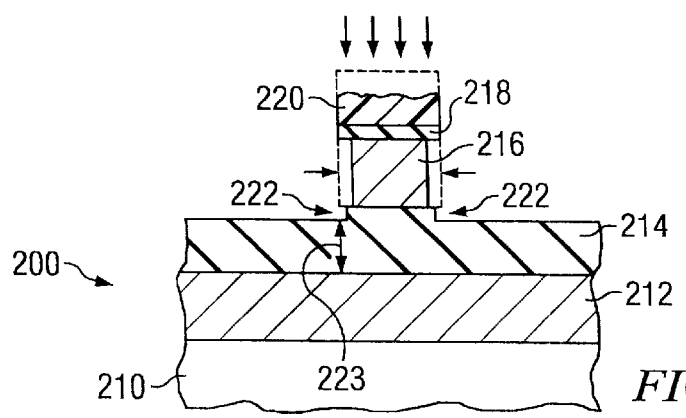
FIGS. 3–6 show cross-sectional views of a preferred embodiment of the present invention, wherein the top plate is pulled back beneath the etch stop layer so that no portion of the top plate resides over a thinned region of the capacitor dielectric layer.

Referring now to FIG. 3, a semiconductor wafer 200 having a substrate 210 is provided. The substrate 210 typically comprises a semiconductor material such as single-crystal silicon, and may include other conductive layers or other semiconductor elements such as transistors or diodes, as examples. The substrate 210 may alternatively comprise compound semiconductors such as GaAs, InP, Si/Ge, SiC, as examples. The substrate 210 is also referred to herein as a workpiece. The substrate 210 or workpiece may include field oxide, active component regions, and/or shallow trench isolation or deep trench isolation regions, not shown.

A first conductive layer 212 is formed or deposited over the substrate 210. The first conductive layer 212 typically comprises a metal such as aluminum, tungsten, titanium or copper, or combinations thereof, for example. The first conductive layer 212 may be 700 Angstroms thick, for example, and may alternatively comprise 500 to 1000 Angstroms, for example. The first conductive layer 212 may alternatively comprise other conductive materials, for example.

A capacitor dielectric layer 214 is deposited over the first conductive layer 212. The capacitor dielectric layer 214 typically comprises an insulator, such as silicon dioxide or silicon nitride, and alternatively, the capacitor dielectric layer 214 may comprise low or high dielectric constant materials, for example. The capacitor dielectric layer 214 may alternatively comprise other dielectric materials, for example. The capacitor dielectric layer 214 may be 540 Angstroms thick, for example, and may alternatively comprise 300 to 1000 Angstroms, for example. The capacitor dielectric layer 214 will be patterned and etched to form capacitor dielectric 214, either before or after the top conductive layer 214 is patterned and etched.

A second conductive layer 216 is formed or deposited over the capacitor dielectric layer 214. The second conductive layer 216 typically comprises a metal such as aluminum, tungsten, titanium, or copper, or combinations thereof. The second conductive layer 216 may be 600 Angstroms thick, for example, and may alternatively comprise 500 to 1000 Angstroms, for example. The second conductive layer 216 may alternatively comprise other conductive materials, for example.

An etch stop layer 218 is then deposited over the second conductive layer 216. The etch stop layer 218 typically comprises an insulating material, such as silicon nitride, although other insulating layers may also be used. The etch stop layer 218 may be 400 Angstroms thick, for example, and may alternatively comprise 300 to 600 Angstroms, for example. The etch stop layer 218 will function as an etch stop when vias are formed later in the fabrication process to make electrical contact to the second conductive layer 216, which will form the top plate 216 of the MIM capacitor.

A photoresist 220 is deposited over the etch stop layer 218. The photoresist 220 is patterned and etched to leave portions of the photoresist 220 over the etch stop layer 218, as shown. The photoresist 220 preferably comprises an organic polymer commonly used in semiconductor lithography, for example.

In accordance with embodiments of the present invention, the wafer 200 is exposed to an etchant to pattern the etch stop layer 218 and the top plate 216. The etchant preferably comprises a gas, and the etch process may comprise RIE, for example. The etch process slightly etches the top surface of the capacitor dielectric 214, and may also etch an undercut region 222 beneath the edges of the top plate 216, as shown. The etch process may comprise a timed etch, so that a small portion of the capacitor dielectric 214 is removed, undesirably creating the undercut region 222, for example.

The top plate 216 may be several to several hundred μm thick, for example. The dimensions of the top plate 216 and bottom plate 212, and thickness and material of the capacitor dielectric material 214, are selected in accordance with the desired properties of the MIM capacitor. The MIM capacitor dielectric may be in the order of 1.2 $fF/\mu m^2$ unit capacitance, for example.

Figure 4:
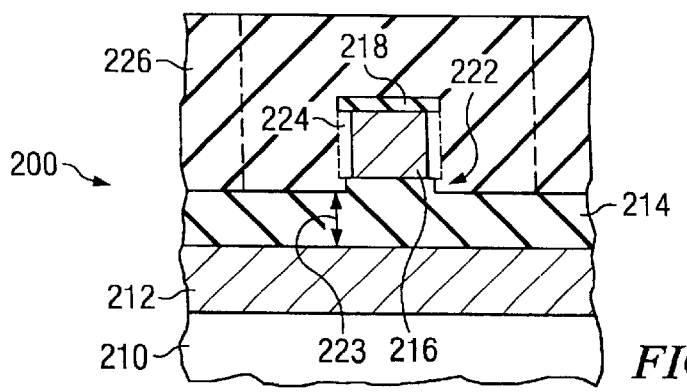

The photoresist 220 is then removed, as shown in FIG. 4. In accordance with a preferred embodiment of the present invention, a modified resist 220 strip is used. In this embodiment, during the photoresist 220 removal, an additive is included in the etchant gas or liquid that pulls back the edges of the top plate 216, as shown in FIG. 3. The additive preferably comprises $CF_4$, particularly when the top plate 216 comprises titanium nitride. The etch additive selection is determined by and is specific to the material the top plate 216 is comprised of. The additive alternatively may comprise other chemistries that will remove a portion of the top plate 216 edges, for example. The etch process to remove the photoresist 220 and top plate 216 edge material preferably comprises a timed etch of less than 60 seconds, for example, and more preferably ranges from 10 to 40 seconds, as examples. As the photoresist 220 is reduced and removed, the edges of the top plate 216 that were exposed as a result of the patterning of the second conductive material layer 216, are removed or pulled back, as shown.

In another preferred embodiment of the present invention, the resist strip is not modified, but rather, the resist is removed after the top plate 216 etch, using prior art resist removal techniques, such as an $O_2$ plasma strip process, as an example, although alternatively, other resist strip processes may be used. Then, in an additional, separate etching step, the top plate 216 edges are etched back or pulled-back, as shown in FIG. 4. The top plate 216 pull-back back etch may comprise a wet etch, for example, although other etch processes may be used. The top plate 216 pull-back etch is preferably highly selective and is isotropic, for example.

After the photoresist 220 is removed, the resulting structure is shown in FIG. 4, wherein the top plate 216 has a width that is less than the width of the etch stop layer 218. Preferably, the top plate 216 has a width that is less than or equal to the width of the capacitor dielectric 214. The pull-back region 224 of the top plate 216 has been removed, such that the top plate 216 resides over a portion of the capacitor dielectric material 214, having a full and complete thickness. In particular, the top plate 216 does not reside over any undercut region 222 of the capacitor dielectric layer 214. The amount of second conductive material 216 that is removed from the edges is preferably 300 nm or less, and more preferably, between 50 and 200 nm, for example.

Figure 5:
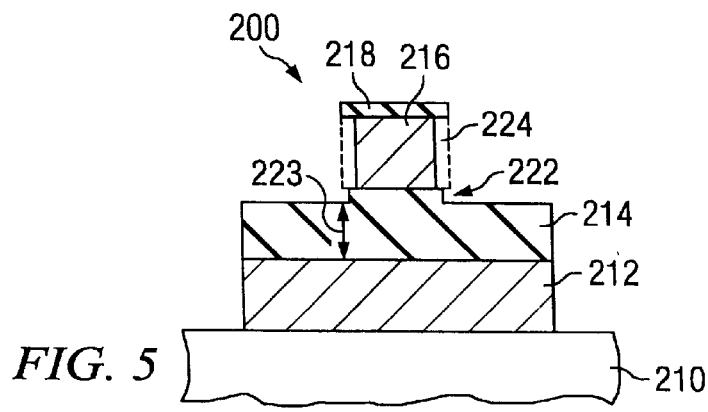

The fabrication process for the MIM capacitor then proceeds as usual. For example, a photoresist layer 226 may be deposited over the entire wafer 200, as shown in FIG. 4, and the photoresist 226 is patterned with the pattern of the bottom plate 212. The pattern from the photoresist 226 is transferred to the capacitor dielectric layer 214 and bottom plate 212, as shown in FIG. 5. Alternatively, the bottom plate 212 may be patterned before the top plate 216 is patterned, for example (not shown).

Figure 6:
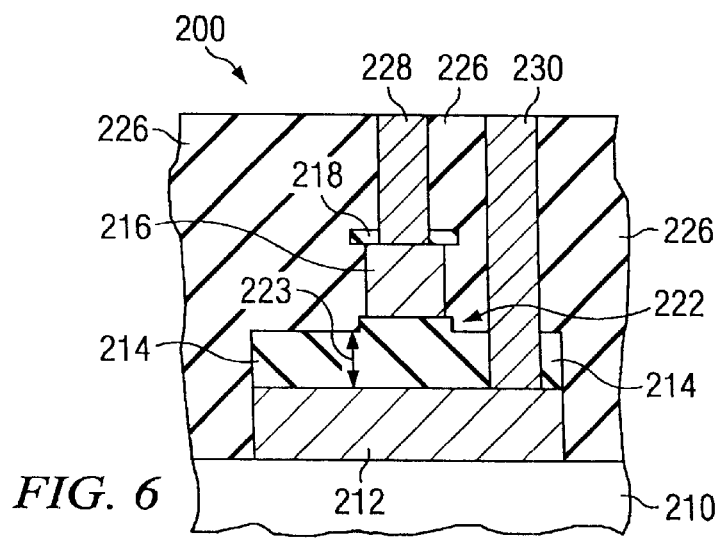

An insulating layer 226 is then deposited over the wafer 200, as shown in FIG. 6. The insulating layer 226 may comprise an inter-layer dielectric layer, for example. The insulating layer 226 may then be patterned with via structures to make electrical contact to the underlying top plate 216 and bottom plate 212. For example, a first via 228 may be formed that abuts the top plate 216, and a second via 230 may be formed within the insulating layer 226 that abuts the bottom plate 212. Metallization layers may subsequently be deposited and patterned that make electrical contact with the first 228 and second 230 via, for example (not shown).

Embodiments of the present invention achieve technical advantages as an improved MIM capacitor and method of fabrication thereof. The MIM capacitor having a top plate 216 with an edge pull-back region 224 results in a MIM capacitor that has no electrical shorts or voltage breakdown in the edge region of the top plate 216. In one embodiment, no additional etch processes are used; rather, an additive is included in the resist strip processes.

Figure 7A:
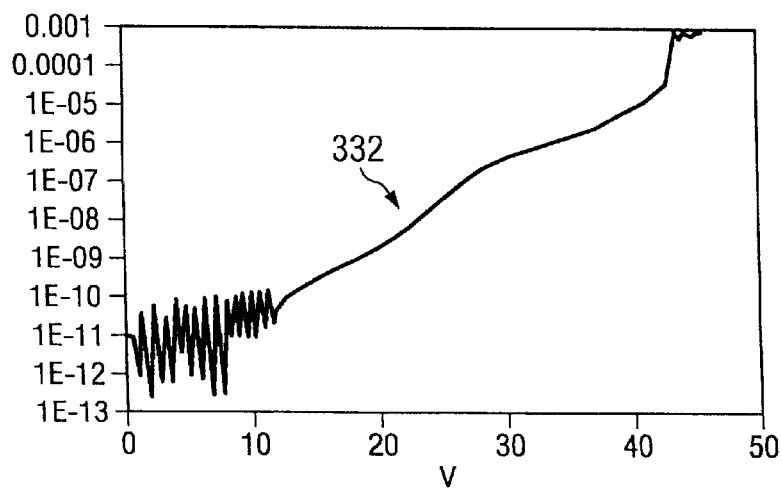
FIGS. 7a and 7b are graphs of the current-voltage (IV) sweeps for embodiments of the present invention (FIG. 7a) compared with prior art MIM capacitors (FIG. 7b), respectively.
Figure 7B:
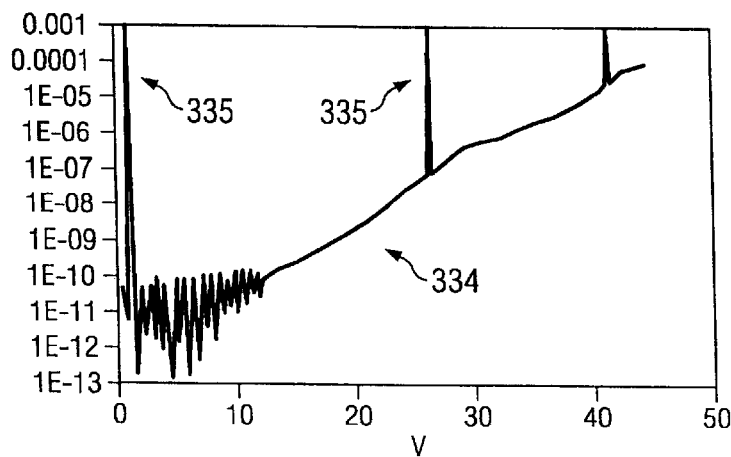

FIG. 7a shows a plot of the voltage sweep that was measured for several MIM capacitors fabricated in accordance with embodiments of the present invention, at 332. A voltage of 0 to 40 volts was applied across the plates of MIM capacitors made in accordance with embodiments of the present invention, and the current was measured, flowing through the MIM capacitors. Over this voltage range, no premature voltage breakdown of MIM capacitors fabricated in accordance with embodiments of the present invention was measured. In comparison, FIG. 7b shows the same voltage sweep measurement that was made on MIM capacitors of the prior art having no pull-back of the top plate, generally at 334. Several measurements of failed MIM capacitors were made, as seen at 335 in the graph shown in FIG. 7b.

Figure 8:
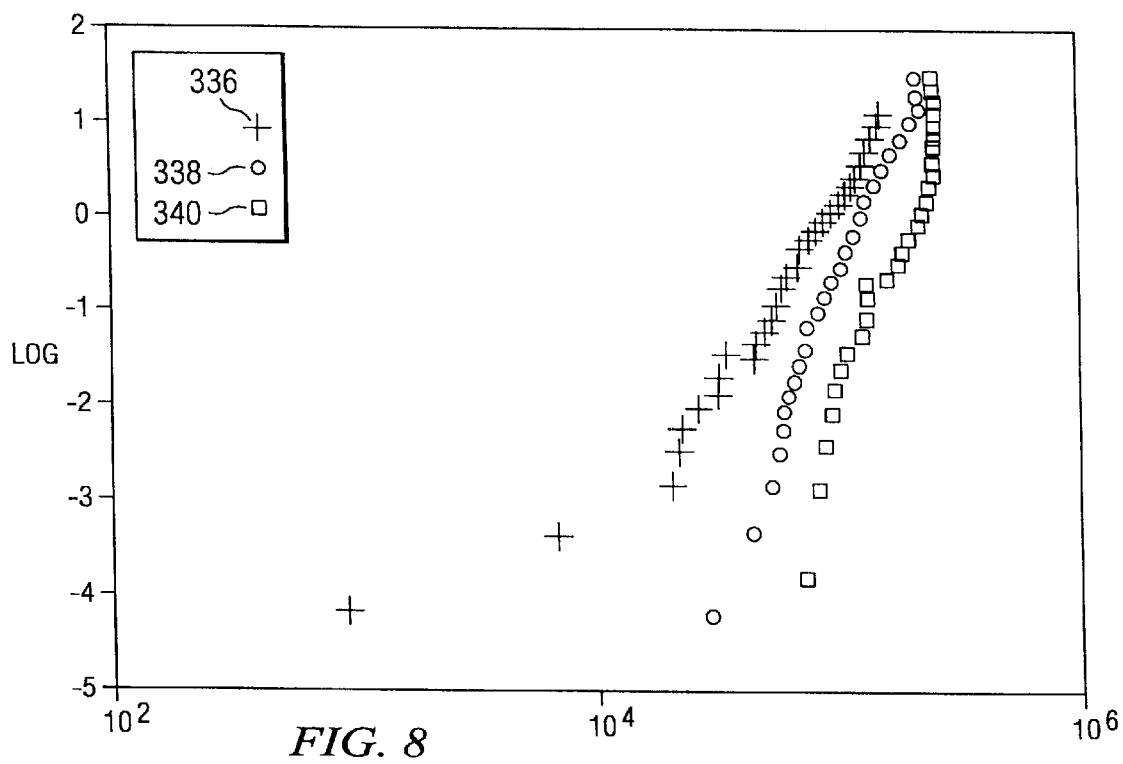
FIG. 8 illustrates a Weibull plot for various amounts of top plate pull-back in accordance with embodiments of the present invention.

Experimental results show that the greater the amount of pullback of the top plate 216, the MIM capacitor performance improves, also. For example, a Weibull plot, a measurement of reliability, is shown in FIG. 8 for a pullback of 50 nm at 336, 100 nm at 338, and 200 nm at 340 indicates that the 200 nm pullback at 340 showed the best performance.

In accordance with embodiments of the present invention, preferably, the etch stop material 218 comprises the same material as the capacitor dielectric material 214. In a preferred embodiment the etch stop material 218 and capacitor dielectric 214 comprise silicon nitride, e.g., $Si_3N_4$. Alternatively, the etch stop layer 218 and capacitor dielectric layer 214 may be comprised of other insulating materials, and the etch stop layer 218 may comprise a different material than the capacitor dielectric layer 214 material, for example.

In a preferred embodiment of the present invention, the second conductive layer 216 comprises titanium nitride (TiN), and the first conductive layer 212 comprises titanium nitride, for example. Alternatively, the second conductive layer 216 and first conductive layer 212 may comprise copper, aluminum, tungsten, titanium nitride, or combinations thereof, as examples. The MIM capacitor described herein may be manufactured in a copper back-end-of the line (BEOL), for example.

Although the present invention and its advantages have been described in detail, it should be understood that various changes, substitutions and alterations can be made herein without departing from the spirit and scope of the invention as defined by the appended claims. For example, it will be readily understood by those skilled in the art that the material, processes, and the order thereof may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   providing a workpiece;
   depositing a first conductive layer over the workpiece;
   depositing a capacitor dielectric layer over the first conductive layer;
   depositing a second conductive layer over the capacitor dielectric layer;
   disposing a first insulating layer over the second conductive layer;
   depositing a photoresist over the first insulating layer;
   patterning the photoresist;
   using the photoresist as a mask, patterning the first insulating layer and the second conductive layer, leaving the edges of the second conductive layer exposed; and
   removing the photoresist and removing a portion of the second conductive layer edges.

2. The method according to claim 1, wherein patterning the first insulating layer and the second conductive layer comprises removing a top portion of the capacitor dielectric layer.

3. The method according to claim 2, wherein removing the top portion of the capacitor dielectric layer comprises removing a portion of the capacitor dielectric layer from beneath the second conductive layer, leaving a thinned region of capacitor dielectric layer, wherein after removing a portion of the second conductive layer edges, no portion of the second conductive layer resides over the thinned region of the capacitor dielectric layer.

4. The method according to claim 1, wherein depositing the first insulating layer comprises depositing the same material as the capacitor dielectric layer material.

5. The method according to claim 1, wherein depositing the capacitor dielectric layer comprises depositing silicon nitride or silicon oxide.

6. The method according to claim 1, wherein disposing a first insulating layer comprises disposing silicon nitride or silicon oxide.

7. The method according to claim 1, wherein depositing the first conductive layer comprises depositing titanium nitride, tungsten, copper, aluminum, or combinations thereof.

8. The method according to claim 1, wherein depositing the second conductive layer comprises depositing titanium nitride, tungsten, copper, aluminum, or combinations thereof.

9. The method according to claim 1, wherein removing the photoresist and removing a portion of the second conductive layer edges comprise a single etch step.

10. The method according to claim 9, wherein removing the photoresist and removing the portion of the second conductive layer edges comprises an etch process including $CF_4$.

11. The method according to claim 1, wherein removing the photoresist comprises a photoresist strip step and removing a portion of the second conductive layer edges comprises a separate selective isotropic wet etch step.

12. The method according to claim 1, wherein removing the portion of the second conductive layer edges comprises removing 300 nm or less of the second conductive layer.

13. The method according to claim 1, further comprising patterning the capacitor dielectric layer and the first conductive layer, wherein the second conductive layer comprises a top plate and the first conductive layer comprises a bottom plate of a metal-insulator-metal (MIM) capacitor.

14. The method according to claim 13, further comprising:
   depositing a second insulating layer over the first insulating layer, and forming vias in the second insulating layer to contact the top plate and the bottom plate.

15. The method according to claim 14, wherein the first insulating layer comprises an etch stop for the top plate via formation.

16. A method of fabricating a metal-insulator-metal (MIM) capacitor, the method comprising:
   providing a workpiece;
   depositing a first conductive layer over the workpiece;
   depositing a capacitor dielectric layer over the first conductive layer;
   depositing a second conductive layer over the capacitor dielectric layer;
   depositing an etch stop material over the second conductive layer;
   depositing a photoresist over the etch stop material;
   patterning the photoresist;
   using the photoresist as a mask, patterning the etch stop material and the second conductive layer, leaving the edges of the second conductive layer exposed, wherein the patterned second conductive layer forms a top plate of a MIM capacitor;
   removing the photoresist and removing a portion of the second conductive layer edges;
   patterning the capacitor dielectric layer; and
   patterning the first conductive layer to form a bottom plate of a MIM capacitor.

17. The method according to claim 16, wherein patterning the etch stop material and the second conductive layer comprises removing a top portion of the capacitor dielectric layer.

18. The method according to claim 17, wherein removing the top portion of the capacitor dielectric layer comprises removing a portion of the capacitor dielectric layer from beneath the second conductive layer, leaving a thinned region of capacitor dielectric layer, wherein after removing a portion of the second conductive layer edges, no portion of the second conductive layer resides over the thinned region of the capacitor dielectric layer.

19. The method according to claim 16, wherein depositing the etch stop material comprises depositing the same material as the capacitor dielectric layer material.

20. The method according to claim 19, wherein depositing the capacitor dielectric layer and depositing the etch stop material comprises depositing silicon nitride or silicon oxide.

21. The method according to claim 16, wherein depositing the first conductive layer comprises depositing titanium nitride, tungsten, copper, aluminum, or combinations thereof.

22. The method according to claim 16, wherein depositing the second conductive layer comprises depositing titanium nitride, tungsten, copper, aluminum, or combinations thereof.

23. The method according to claim 16, wherein removing the photoresist and removing the portion of the second conductive layer edges comprise a single etch step.

24. The method according to claim 23, wherein removing the photoresist and removing the portion of the second conductive layer edges comprises an etch process including $CF_4$.

25. The method according to claim 16, wherein removing the photoresist comprises a photoresist strip step and removing a portion of the second conductive layer edges comprises a separate selective isotropic wet etch step.

26. The method according to claim 16, wherein removing the portion of the second conductive layer edges comprises removing 300 nm or less of the second conductive layer.

27. The method according to claim 16, further comprising:
    depositing a second insulating layer over the etch stop material; and
    forming vias in the second insulating layer to contact the top plate and the bottom plate, wherein the etch stop material comprises an etch stop for the top plate via formation.

28. A metal-insulator-metal (MIM) capacitor, comprising:
    a bottom plate, the bottom plate having a first width;
    a capacitor dielectric disposed over the bottom plate;
    a top plate disposed the capacitor dielectric, the top plate having a second width, wherein the second width is less than the first width; and
    an etch stop material disposed over the top plate, the etch stop material having a third width, wherein the second width is less than the third width.

29. The MIM capacitor according to claim 28, further comprising:
    an insulating layer disposed over the etch stop material;
    a first via formed within the insulating layer abutting the top plate and extending to a top surface of the insulating layer; and
    a second via formed within the insulating layer abutting the bottom plate and extending to the top surface of the insulating layer.

30. The MIM capacitor according to claim 28, wherein the bottom plate comprises titanium nitride, tungsten, copper, aluminum, or combinations thereof.

31. The MIM capacitor according to claim 28, wherein the top plate comprises titanium nitride, tungsten, copper, aluminum, or combinations thereof.

32. The MIM capacitor according to claim 28, wherein the capacitor dielectric comprises silicon nitride or silicon oxide.

33. The MIM capacitor according to claim 28, wherein the etch stop material comprises silicon nitride or silicon oxide.

34. The MIM capacitor according to claim 28, wherein the etch stop material comprises the same material as the capacitor dielectric.

35. The MIM capacitor according to claim 28, wherein the capacitor dielectric has a fourth width, wherein the second width is less than or equal to the fourth width.

\* \* \* \* \*